US012671369B2

(12) United States Patent
Khare et al.

(10) Patent No.: US 12,671,369 B2
(45) Date of Patent: Jun. 30, 2026

(54) REDUCTION OF ARTEFACTS IN MULTI-CHANNEL SYSTEMS

(71) Applicant: Cirrus Logic International Semiconductor Ltd., Edinburgh (GB)

(72) Inventors: Rupesh Khare, Newbury (GB); Mehul Mistry, Newbury (GB); Gautham Sathyanarayanan, Newbury (GB)

(73) Assignee: Cirrus Logic Inc., Austin, TX (US)

( * ) Notice: Subject to any disclaimer, the term of this patent is extended or adjusted under 35 U.S.C. 154(b) by 149 days.

(21) Appl. No.: 18/476,962

(22) Filed: Sep. 28, 2023

(65) Prior Publication Data

US 2024/0204734 A1 Jun. 20, 2024

Related U.S. Application Data

(60) Provisional application No. 63/432,798, filed on Dec. 15, 2022.

(30) Foreign Application Priority Data

Jan. 31, 2023 (GB) ...................................... 2301372

(51) Int. Cl.
*H03F 1/52* (2006.01)
*H03F 3/45* (2006.01)
(52) U.S. Cl.
CPC ......... *H03F 1/523* (2013.01); *H03F 3/45071* (2013.01); *H03F 2200/441* (2013.01)
(58) Field of Classification Search
CPC ................. H03F 1/523; H03F 3/45071; H03F 2200/441; H03F 1/305; H03F 2200/129;

H03F 3/45475; H03F 3/68; H03F 2200/03; H03F 3/187; H03F 1/30; H03F 1/301; H03F 1/3211; H03F 3/189; H03F 3/191;

(Continued)

(56) References Cited

U.S. PATENT DOCUMENTS

| | | | | |
|---|---|---|---|---|
| 5,491,839 A | * | 2/1996 | Schotz | ..................... H04B 1/04 |
| | | | | 455/39 |
| 6,987,422 B2 | * | 1/2006 | Vice | ..................... H03G 1/0088 |
| | | | | 330/285 |

(Continued)

FOREIGN PATENT DOCUMENTS

| | | | | | |
|---|---|---|---|---|---|
| CN | 1048297 A | * | 1/1991 | | |
| CN | 110321098 B | * | 2/2023 | ............. | G06F 3/162 |

(Continued)

OTHER PUBLICATIONS

Combined Search and Examination Report under Sections 17 and 18(3), UKIPO, Application No. GB2301372.5, mailed Jul. 31, 2023.

*Primary Examiner* — Gerald Gauthier
(74) *Attorney, Agent, or Firm* — Jackson Walker L.L.P.

(57) ABSTRACT

Circuitry for driving first and second loads, the circuitry comprising: a first output signal path for supplying a first driving signal to the first load; a second output signal path for supplying a second driving signal to the second load; sequencer circuitry configured to initiate a first state change in the first output signal path and a second state change in the second output signal path, wherein the sequencer circuitry is configured to control the initiation of the first and second state changes such that the second state change is not synchronised with the first state change.

13 Claims, 8 Drawing Sheets

(58) Field of Classification Search
CPC ........ H03F 3/211; H03F 3/2171; H03F 3/245;
H03F 3/45264; G01S 7/032; H02M 1/36;
H03G 1/0029; H03G 1/0088
See application file for complete search history.

(56) References Cited

U.S. PATENT DOCUMENTS

| | | | | |
|---|---|---|---|---|
| 7,492,217 B2 * | 2/2009 | Hansen | ................ | H03F 3/68 330/10 |
| 7,797,065 B2 * | 9/2010 | Zaucha | ................ | H03F 3/68 381/107 |
| 8,179,648 B1 * | 5/2012 | Loeb | ................ | H03F 3/191 330/281 |
| 8,581,661 B2 * | 11/2013 | Friend | ................ | H03G 1/0088 330/69 |
| 2007/0005160 A1 | 1/2007 | Zaucha et al. | | |
| 2007/0030061 A1 | 2/2007 | Cho et al. | | |
| 2008/0159567 A1 * | 7/2008 | Lesso | ................ | H03F 1/56 381/120 |
| 2009/0116654 A1 * | 5/2009 | Hansen | ................ | H03F 3/68 381/28 |
| 2012/0039487 A1 * | 2/2012 | Sakai | ................ | H03F 3/187 330/252 |
| 2013/0099857 A1 * | 4/2013 | Friend | ................ | H03G 1/0088 330/69 |
| 2014/0042994 A1 * | 2/2014 | Choi | ................ | H02M 1/36 323/234 |
| 2015/0137888 A1 * | 5/2015 | Yang | ................ | H03F 3/211 330/261 |
| 2015/0145604 A1 * | 5/2015 | Scott | ................ | H03F 3/68 330/296 |
| 2017/0310280 A1 * | 10/2017 | LaBundy | ................ | H03F 3/187 |
| 2018/0076771 A1 * | 3/2018 | Gomez | ................ | H03F 1/305 |
| 2019/0245494 A1 * | 8/2019 | Ohtani | ................ | H03F 3/2171 |
| 2019/0363678 A1 * | 11/2019 | Wang | ................ | H03F 1/301 |
| 2020/0153394 A1 * | 5/2020 | Khlat | ................ | H03F 3/189 |
| 2020/0403579 A1 * | 12/2020 | Hsieh | ................ | H03G 1/0029 |
| 2020/0403615 A1 * | 12/2020 | Eschbaumer | ................ | H03F 3/245 |
| 2021/0091736 A1 * | 3/2021 | Chen | ................ | H03F 3/45475 |
| 2021/0175322 A1 * | 6/2021 | Melanson | ................ | H03F 3/187 |
| 2021/0242847 A1 * | 8/2021 | Singleton | ................ | H03F 3/45645 |
| 2021/0328559 A1 * | 10/2021 | Balar | ................ | G01S 7/032 |
| 2021/0391831 A1 * | 12/2021 | Lesso | ................ | H03F 1/3211 |
| 2021/0399693 A1 * | 12/2021 | Tang | ................ | H03F 3/45475 |
| 2022/0045655 A1 * | 2/2022 | Huang | ................ | H03F 1/30 |
| 2022/0231643 A1 * | 7/2022 | Jalili Sebardan | ... | H03F 3/45264 |
| 2023/0238925 A1 * | 7/2023 | Tang | ................ | H03F 3/45475 330/251 |
| 2024/0204734 A1 * | 6/2024 | Khare | ................ | H03F 1/523 |

FOREIGN PATENT DOCUMENTS

| JP | 2005295011 A | 10/2005 | | |
|---|---|---|---|---|
| TW | I601377 B | * 10/2017 | ....... | H01L 23/53252 |

* cited by examiner

510 — DISABLE ZERO-CROSSING DETECTION

520 — ENABLE FIRST AMPLIFIER CIRCUITRY, OPEN FIRST CLAMP SWITCH

530 — RECONFIGURE FIRST AMPLIFIER CIRCUITRY TO NORMAL CONFIGURATION, REMOVE FIRST DAC INPUT SIGNAL

540 — ENABLE SECOND AMPLIFIER CIRCUITRY, OPEN SECOND CLAMP SWITCH

550 — RECONFIGURE SECOND AMPLIFIER CIRCUITRY TO NORMAL CONFIGURATION, REMOVE SECOND DAC INPUT SIGNAL

500

REDUCTION OF ARTEFACTS IN MULTI-CHANNEL SYSTEMS

FIELD OF THE INVENTION

The present disclosure relates to reduction of artefacts in output paths of multi-channel systems such as multi-channel audio or haptic transducer driver systems.

BACKGROUND

In audio driver circuitry, audible artefacts such as audible clicks or pops can occur as a result of transient voltages across a load such as a speaker, particularly during state changes such as may occur on start-up or shut down of the circuitry.

Similarly, in haptic driver circuitry, artefacts which manifest as vibrations or other undesired movements may occur as a result of transient voltages across a load such as a resonant actuator or other haptic transducer, particularly during state changes such as may occur on start-up or shut down of the circuitry.

Such driver circuitry is usually calibrated (e.g. during a production test phase of a manufacturing process) using one-time programmable (OTP) components or other techniques to minimise any offsets in components (e.g. digital to analog converters, amplifiers and the like) of output signal paths of the driver circuitry that could give rise to such artefacts.

In multi-channel driver circuitry, two or more output signal paths may share a common ground connection (e.g. may be coupled to a common ground rail). Such arrangements can give rise to additional artefacts, as voltage transients from one output signal path may appear on the other output signal path(s).

SUMMARY

According to a first aspect, the invention provides circuitry for driving first and second loads, the circuitry comprising:

a first output signal path for supplying a first driving signal to the first load;

a second output signal path for supplying a second driving signal to the second load;

sequencer circuitry configured to initiate a first state change in the first output signal path and a second state change in the second output signal path, wherein the sequencer circuitry is configured to control the initiation of the first and second state changes such that the second state change is not synchronised with the first state change.

The first output signal path may comprise first digital to analog converter (DAC) circuitry and first amplifier circuitry.

The second output signal path may comprise first digital to analog converter (DAC) circuitry and second amplifier circuitry.

The circuitry may further comprise a common ground path for the first and second output signal paths.

The first load and/or the second load may comprise an audio output transducer.

The first load and/or the second load may comprise a haptic output transducer.

The first and second DAC circuitry may comprise ground-referenced DAC circuitry.

The first and second amplifier circuitry may comprise split-supply amplifier circuitry.

The circuitry may further comprise:

a first clamp path coupled to an output of the first amplifier circuitry; and a second clamp path coupled to an output of the first amplifier circuitry.

The first and second state changes may occur during a start-up process or a shut-down process for the circuitry.

The sequencer circuitry may be configured to, during the start-up process, enable the second output signal path after enabling the first output signal path.

Enabling the first output signal path may comprise:

coupling the first amplifier circuitry to a power supply;

disabling the first clamp path;

reconfiguring the first amplifier circuitry from a unity-gain configuration to a normal configuration; and removing a predefined input signal to the first DAC circuitry.

Enabling the second output signal path may comprise:

coupling the second amplifier circuitry to a power supply;

disabling the second clamp path;

reconfiguring the second amplifier circuitry from a unity-gain configuration to a normal configuration; and removing a predefined input signal to the first DAC circuitry.

The sequencer circuitry may be configured to, during the shut-down process, disable the second output signal path after disabling the first output signal path.

Disabling the first output signal path may comprise:

reconfiguring the first amplifier circuitry from a normal configuration to a unity-gain configuration to a normal configuration;

supplying a predefined input signal to the first DAC circuitry;

decoupling the first amplifier circuitry from a power supply; and enabling the first clamp path.

Disabling the second output signal path may comprise:

reconfiguring the second amplifier circuitry from a normal configuration to a unity-gain configuration to a normal configuration;

supplying a predefined input signal to the second DAC circuitry;

decoupling the second amplifier circuitry from a power supply; and enabling the second clamp path.

According to a second aspect, the invention provides a method for reducing artefacts in a multi-channel system during a state change, the method comprising controlling initiation of the state change in each channel such that the state change in one channel is not synchronised with the state change in another channel.

According to a third aspect, the invention provides integrated circuit comprising circuitry according to the first aspect.

According to a fourth aspect, the invention provides a host device comprising circuitry according to the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
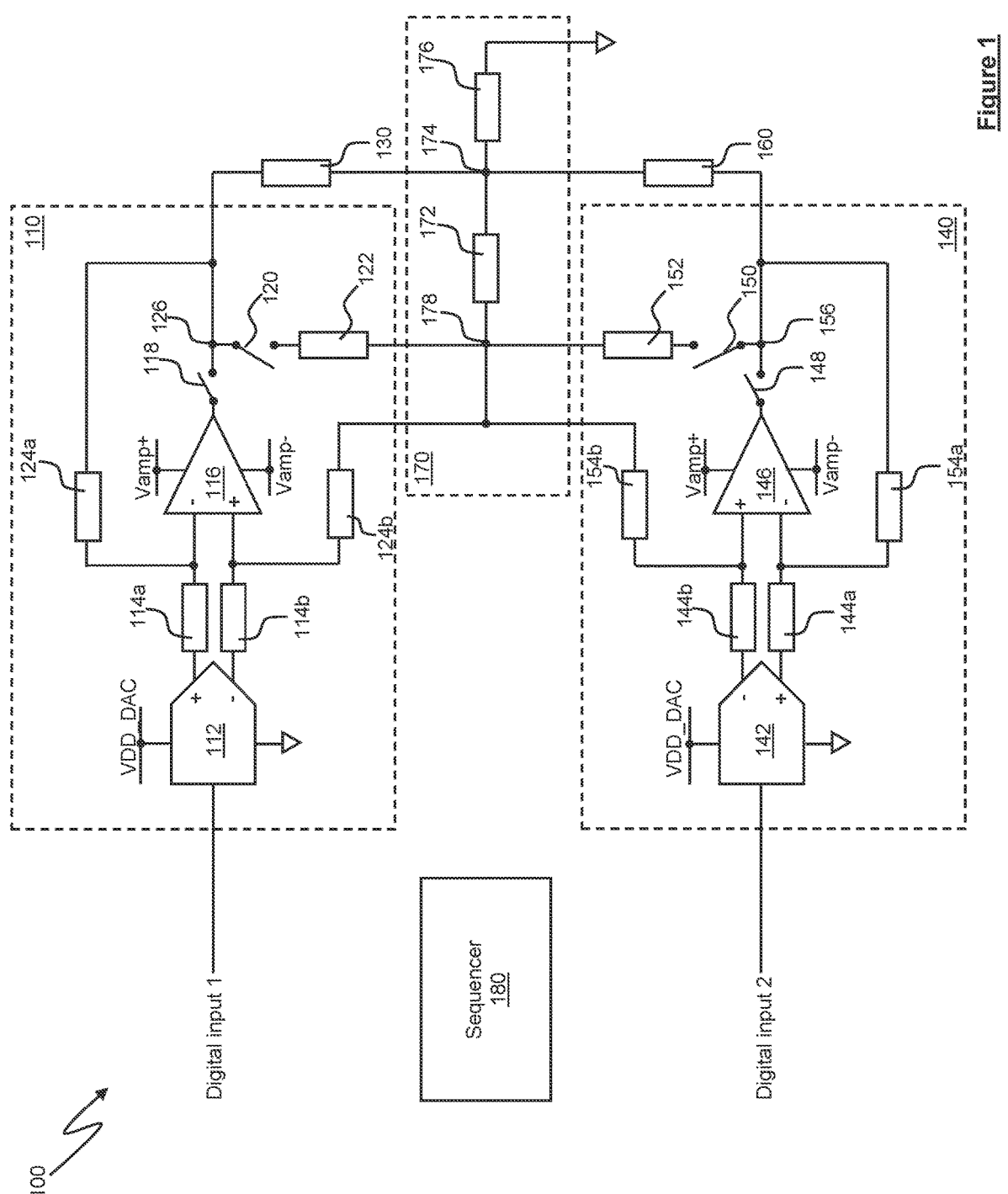
FIG. 1 is a schematic representation of two-channel driver circuitry.

FIG. 1 is a schematic representation of two-channel driver circuitry for driving first and second loads.

The driver circuitry (shown generally at 100 in FIG. 1) in this example comprises a first output signal path 110 for supplying a driving signal to a first load 130 having a resistance RL. The first load 130 may be, for example, an audio transducer (e.g. a speaker) or a haptic transducer (e.g. a resonant actuator).

The driver circuitry 100 further comprises a second output signal path 140 for supplying a driving signal to a second load 160 having a resistance RR. The second load 160 may be, for example, an audio transducer (e.g. a speaker) or a haptic transducer (e.g. a resonant actuator).

The driver circuitry 100 further comprises a common ground path 170 coupled to the first and second output signal paths 110, 140. The common ground path 170 includes a common resistor 172 (having a resistance Rcommon) coupled at a first terminal to feedback paths of the first and second output signal paths, and at a second terminal to a node 174 between the first and second loads 130, 160. A common ground resistor 176 (having a resistance Rground) is coupled at a first terminal to the node 174 and at a second terminal to a common ground (or other reference voltage) supply connection.

The driver circuitry 100 further includes sequencer circuitry 180 for controlling the timing of state changes in the first and second signal paths 110, 140.

The first output signal path 110 comprises first ground-referenced digital to analog converter (DAC) circuitry 112 configured to receive a first digital input signal, which may be, for example, a digital audio signal representing a left audio channel of a stereo audio signal. The first DAC circuitry 112 is coupled to a first positive power supply rail so as to receive a first positive power supply voltage VDD_DAC, and is also coupled to the common ground connection.

First (positive) and second (negative) differential outputs of the first DAC circuitry 112 are coupled, via first and second feedforward resistors 114*a*, 114*b* (each having a resistance Rff), to respective first (inverting) and second (non-inverting) inputs of first differential amplifier circuitry 116.

The first differential amplifier circuitry 116 is coupled to a second positive power supply rail so as to receive a second positive power supply voltage Vamp+, and is coupled to a negative power supply rail so as to receive a negative power supply voltage Vamp-. An output of the first differential amplifier circuitry 116 is coupled to a first terminal of a first amplifier output switch 118. A second terminal of the first amplifier output switch 118 is coupled to a first terminal of the first load 130, and to a first amplifier output clamp path comprising a first clamp switch 120 and a first clamp resistor 122 (having a resistance Rclamp) coupled in series between a first clamp path node 126 between the first amplifier output switch 118 and the first load 130 and a second clamp path node 178 that is coupled to the first terminal of the common resistor 172.

A first amplifier feedback path, coupling the second terminal of the first amplifier output switch 118 to the first input of the first amplifier circuitry 116, includes a first feedback resistor 124*a* (having a resistance Rfb). A second amplifier feedback path, coupling the second terminal of the first amplifier output switch 118 to the second input of the first amplifier circuitry 116, includes the first load 130, the common resistor 172 and a second feedback resistor 124*b* (also having a resistance Rfb).

The second output signal path 140 similarly comprises second ground-referenced digital to analog converter (DAC) circuitry 142 configured to receive a second digital input signal, which may be, for example, a digital audio signal representing a right audio channel of a stereo audio signal. The second DAC circuitry 142 is coupled to the first positive power supply rail so as to receive the first positive power supply voltage VDD_DAC, and is also coupled to the common ground connection.

First (positive) and second (negative) differential outputs of the second DAC circuitry 142 are coupled, via third and fourth feedforward resistors 144*a*, 144*b* (each having a resistance Rff), to respective first (inverting) and second (non-inverting) inputs of second differential amplifier circuitry 146.

The second differential amplifier circuitry 146 is coupled to the second positive power supply rail so as to receive the second positive power supply voltage Vamp+, and is coupled to the negative power supply rail so as to receive the negative power supply voltage Vamp-.

An output of the second differential amplifier circuitry 146 is coupled to a first terminal of a second amplifier output switch 148. A second terminal of the second amplifier output switch 148 is coupled to a first terminal of the second load 160, and to a second amplifier output clamp path comprising a second clamp switch 150 and a second clamp resistor 152 of resistance Rclamp coupled in series between a first clamp path node 156 between the second amplifier output switch 148 and the second load 160 and the second clamp path node.

A third amplifier feedback path, coupling the second terminal of the second amplifier output switch 148 to the first input of the second amplifier circuitry 146, includes a third feedback resistor 154*a*. A fourth amplifier feedback path, coupling the second terminal of the second amplifier output switch 148 to the second input of the second amplifier circuitry 146, includes the second load 160, the common resistor 172 and a fourth feedback resistor 154*b*.

As noted above, the first and second DAC circuitry 112, 142 is ground-referenced, whereas the first and second amplifier circuitry 116, 146 receive split power supplies (i.e. they receive both positive and negative supply voltages). Thus the first and second DAC circuitry 112, 142 perform a level-shifting operation to generate differential output signals centred around a common mode voltage of the first and second amplifier circuitry 116, 146. As a result of this level shifting operation, the differential signals output by the first and second DAC circuitry 112, 142 each include a DC offset.

An effect of this DC offset is that during state transitions of each signal path 110, 140 (e.g. during start up or shutdown of a signal path), a voltage develops across the respective load 130, 160, which can lead to artefacts such as audible clicks or pops (where the load is an audio output transducer such as a speaker) or undesired vibration or movement (if the load is a haptic output transducer such as a resonant actuator).

Figure 2A:
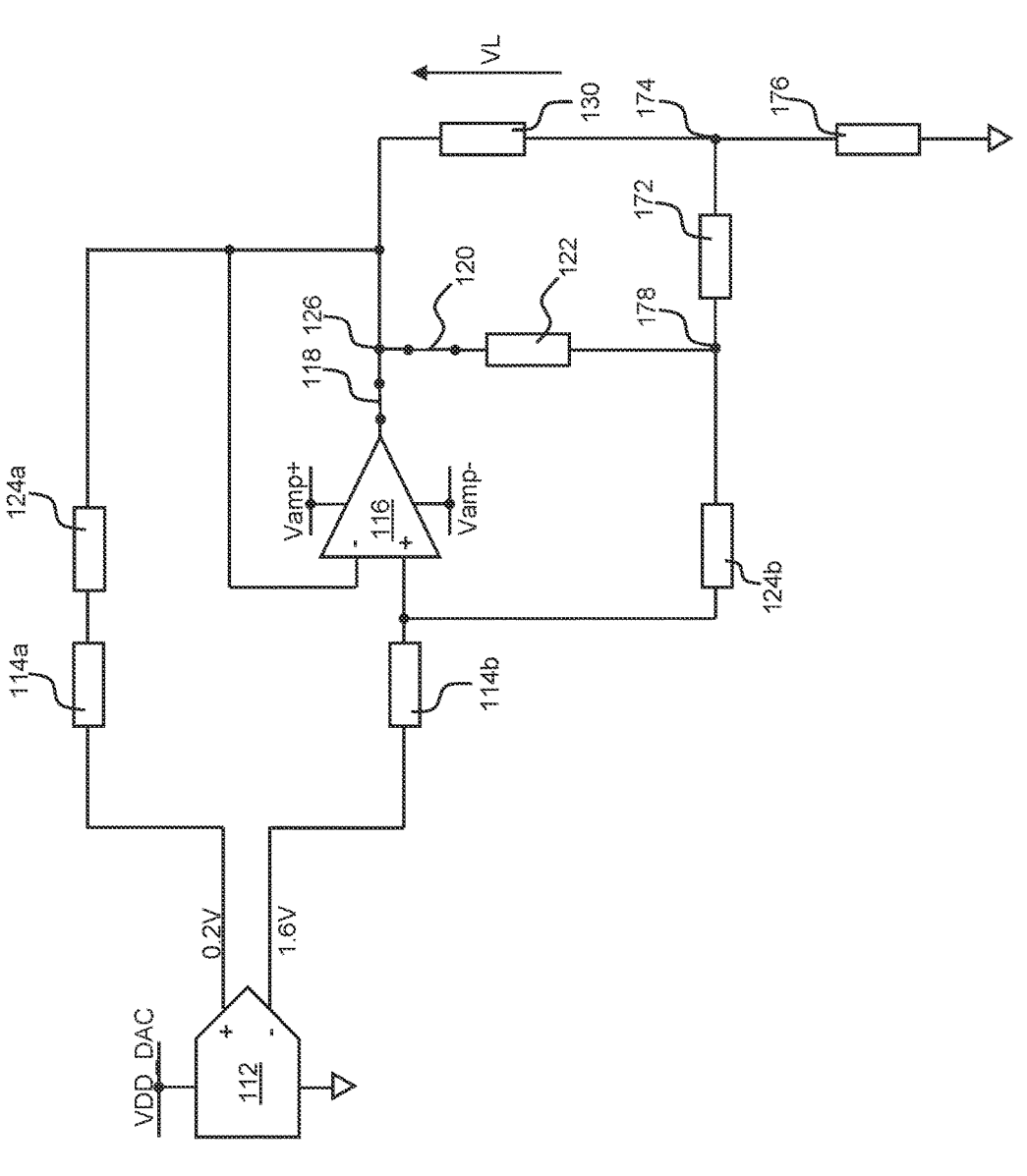
FIGS. 2*a*-2*c* illustrate a sequence of states in an example start-up sequence for an output signal path of the driver circuitry of FIG. 1.
Figure 2B:
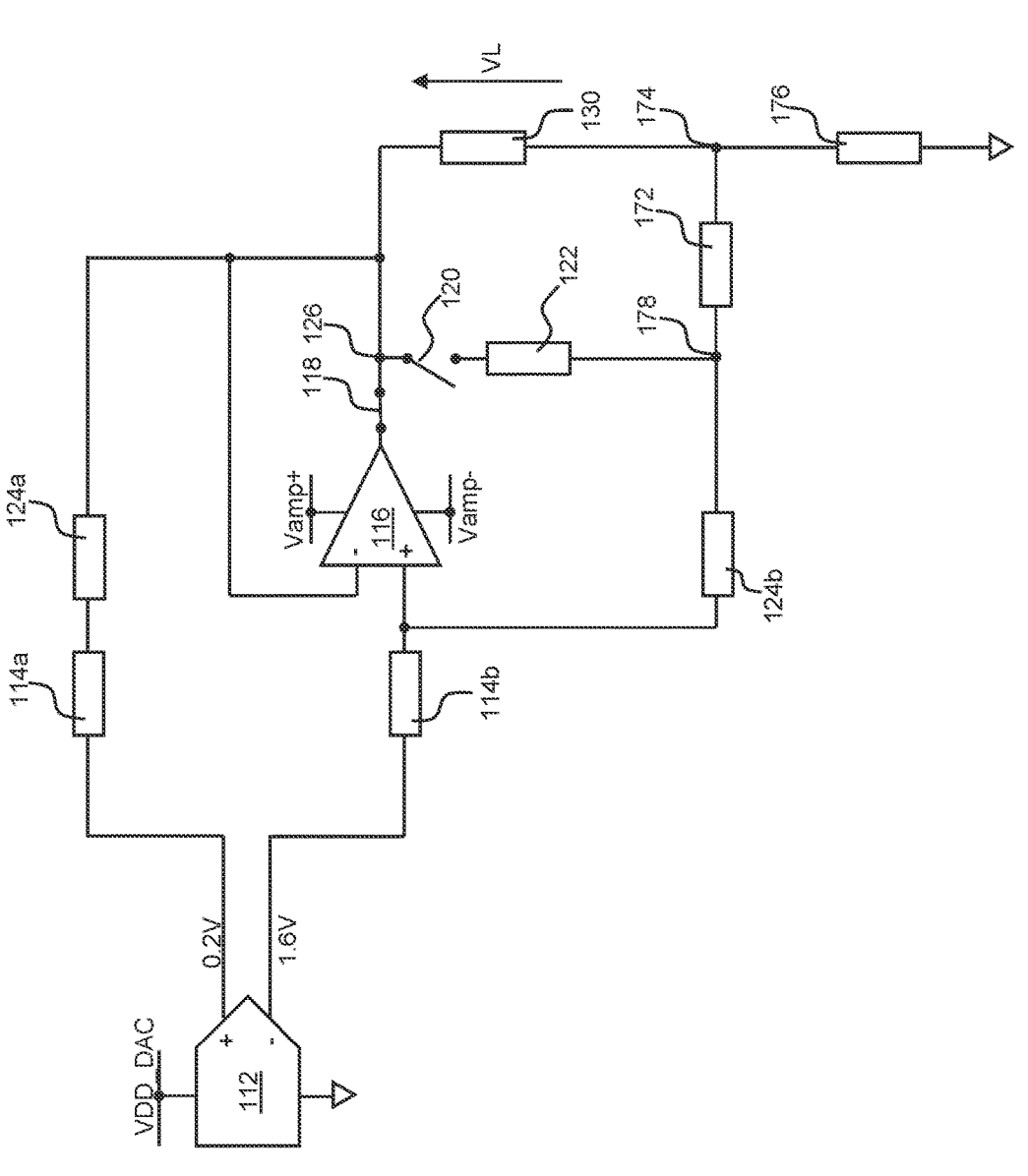
Figure 2C:
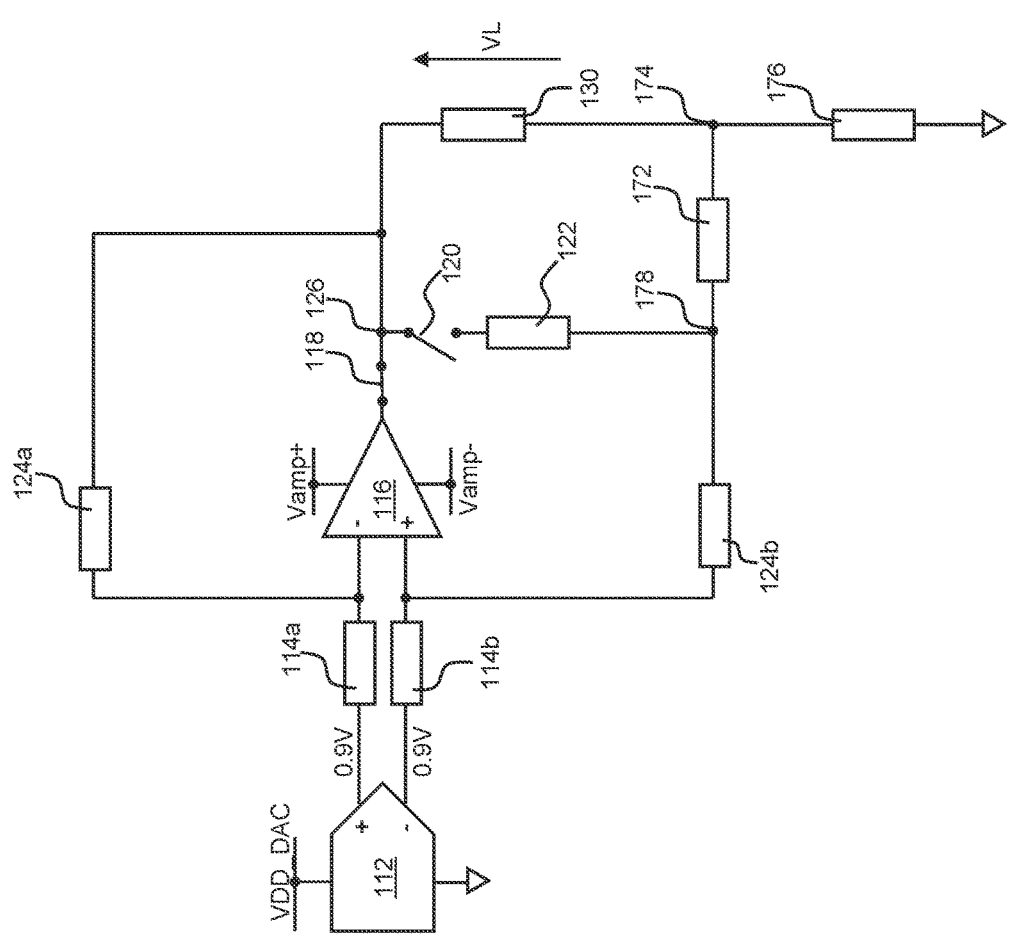
Figure 2C:

FIGS. 2a-2c illustrate a sequence of states of the first output signal path 110 during an example start-up procedure. It will be appreciated that the second output signal path 140 will also adopt the same sequence of states during the start-up procedure. In a first step of the start-up procedure the first output signal path 110 adopts the state or configuration shown in FIG. 2a. In this configuration the first amplifier circuitry 116 is configured as a unity-gain amplifier and disabled (e.g. by decoupling it from the second positive power supply voltage Vamp+ and/or the negative power supply voltage Vamp-), the first clamp switch 120 is closed to couple the output of the first amplifier circuitry 116 to ground, via the first clamp resistor 122, the common resistor 172 and the ground resistor 176. The first DAC circuitry 112 receives an input of −1 and thus outputs an output signal representing an input of −1, which in the illustrated example is achieved by outputting +0.2V at the first output and −1.6V at the second output.

Thus, in a first state of the first output signal path 110 during the start-up procedure, a voltage VL across the first load 130 can be expressed as:

$$VL = \frac{0.2}{(Rff + Rfb)}Rclamp + \frac{1.8}{(Rff + Rfb)}Rcommon. \tag{1}$$

It is assumed for the purposes of this disclosure that (Rff+Rfb)>>Rclamp, Rcommon, RL and Rground.

In a second step of the start-up procedure the first output signal path 110 adopts the state or configuration shown in FIG. 2b. In this configuration the first amplifier circuitry 116 is again configured as a unity-gain amplifier, but is now enabled (e.g. by coupling it to the second positive power supply voltage Vamp+ and the negative power supply voltage Vamp-), the first clamp switch 120 is opened to decouple the output of the first amplifier circuitry 116 from ground, and the first DAC circuitry 112 continues to receive the input digital signal representing a value of −1 and thus to output an output signal representing an input of −1, which in the illustrated example is achieved by outputting +0.2V at the first output and −1.6V at the second output.

Thus, in a second state of the first output signal path 110 during the start-up procedure, the voltage VL across the first load 130 can be expressed as:

$$VL = \frac{1.6}{(Rff + Rfb)}Rcommon + Voff, hp, \tag{2}$$

where Voff, hp is a residual offset voltage of the first amplifier circuitry 116 (which has been calibrated out or compensated for during calibration of the driver circuitry 100).

In a third step of the start-up procedure the first output signal path 110 adopts the state or configuration shown in FIG. 2c. In this configuration the first amplifier circuitry 116 adopts its normal configuration and is enabled (e.g. by coupling it to the second positive power supply voltage Vamp+ and the negative power supply voltage Vamp-), the first clamp switch 120 is opened to decouple the output of the first amplifier circuitry 116 from ground, and the first DAC circuitry 112 receives no input signal, such that its first and second outputs are both at the common mode voltage, which in the illustrated example is 0.9V.

Thus, in a third state of the first output signal path 110 during the start-up procedure, the voltage VL across the first load 130 can be expressed as:

$$VL = \frac{0.9}{(Rff + Rfb)}Rcommon + Voff, hp \tag{3}$$

Thus, over the course of the three different steps or states in the example start-up procedure illustrated in FIGS. 2a-2c, three transient voltages VL of different amplitudes develop across the first load 130.

A shutdown procedure performs the same steps in reverse order, such that (in the illustrated example) the voltage VL across the first load 130 in a first step of the shutdown process can be expressed according to expression 3 above, the voltage VL in a second step of the shutdown process can be expressed according to expression 2 above, and the voltage VL in a third step of the shutdown process can be expressed according to expression 1 above.

A voltage VR across the second load 160 similarly changes over the steps of the start-up and shutdown procedure.

Each change in the voltage across a load 160 can give rise to an artefact such as a click or pop (where the load is an audio output transducer) or a vibration or other movement (where the load is a haptic output transducer).

As the first output signal path 110 and the second output signal path 140 share a common ground connection, transient voltages from the first output signal path 110 appear across the first load 130, and transient voltages from the second output signal path 140 appear across the second load 160.

In typical driver circuitry the first and second output signal paths 110, 140 are enabled or disabled simultaneously, in synchronization with a zero-crossing of an input signal from which the first and second digital input signals are derived. Thus, each of the first, second and third steps described above typically occurs at the same time for the first and second output signal paths 110, 140, which can have the effect of increasing the magnitude of the artefacts that occur on state changes in the output signal paths 110, 140.

Figure 3:
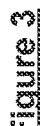
FIG. 3 illustrates voltages across the loads of the circuitry of FIG. 1 over time when state changes in first and second output signal paths are synchronised.

This is shown graphically in FIG. 3, which illustrates the voltages VL (denoted by the dashed line 310) and VR (denoted by the solid line 320) over time. At a time t_enable, the first and second output signal paths 110, 140 are enabled by initiating the first step of the start-up process for each of the output signal paths 110, 140. This leads to an immediate increase in both the voltage VL across the first load 130 and the voltage VR across the second load 160, with both VL and VR reaching a peak voltage of VPEAK, and these voltages can lead to artefacts such as pops or clicks (if the loads 130, 160 are audio transducers) or vibrations or other movements (if the loads 130, 160 are haptic transducers). Similar changes in the voltages VL, VR occur when the states of the first and second output signal paths 110, 140 change during the second and third steps of the start-up sequence, and these changes in the voltages VL, VR may also give rise to output artefacts.

It is desirable to minimise or at least reduce the magnitude of artefacts that occur on such state changes.

If, instead of synchronising state changes of the first and second output signal paths 110, 140, the state changes are staggered or offset in time with respect to each other, any changes in the voltages VR, VL across the loads 130, 160 will be smaller than would be the case if the state changes were synchronised.

Figure 4:
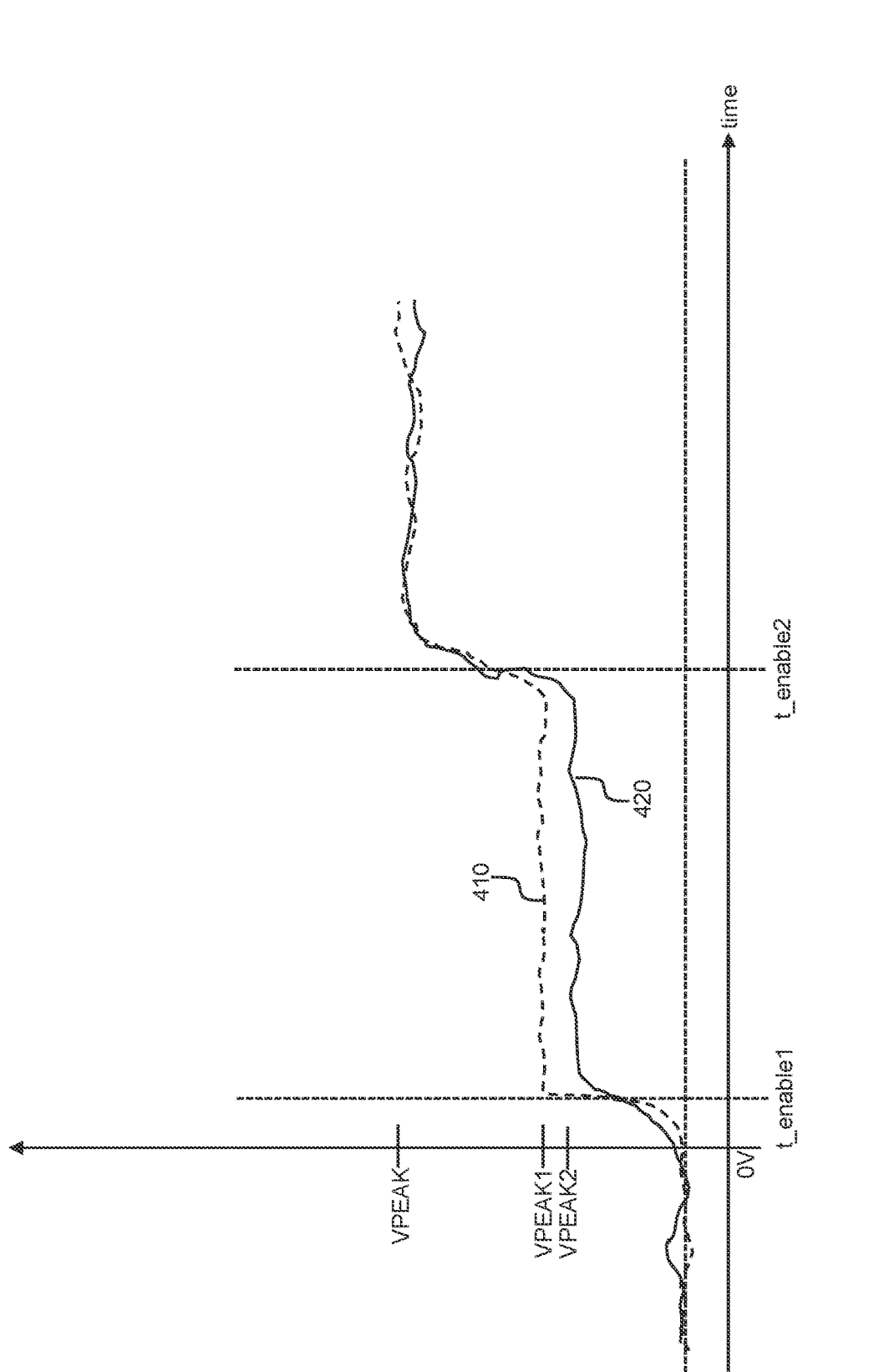
FIG. 4 illustrates voltages across the loads of the circuitry of FIG. 1 over time when state changes in first and second output signal paths are not synchronised in accordance with the present disclosure.

This is shown graphically in FIG. 4, which illustrates the voltages VL (denoted by the dashed line 410) and VR (denoted by the solid line 420) over time. At a time t_en-able1, the first output signal path 110 is enabled, by initiating the first step of the start-up process for that output signal path 110. This leads to an immediate increase in the voltage VL across the first load 130, which in this example rises to a peak voltage VPEAK1, which is lower than the peak voltage VPEAK reached in the example illustrated in FIG. 3. The voltage VR across the second load 160 also increases, in this example to a peak voltage VPEAK2, which is lower than VPEAK1.

At a time t_enable2, which is after t_enable1, the second output signal path 140 is enabled, by initiating the first step of the start-up process for that output signal path 140. This leads to an immediate increase in the voltage VR across the second load 160, which rises, in this example, to a peak voltage VPEAK. The voltage VL across the first load 130 also increases, in this example, to a peak voltage VPEAK.

As will be apparent from FIG. 4, staggering or offsetting the state changes in the first and second output signal paths 110, 140 leads to a first change in the voltages VL, VR across the first and second loads 130, 160 respectively, as a result of the initiation of the start-up process for the first output signal path 110 at time t_enable1, and a second change in the voltages VL, VR across the first and second loads 130, 160 respectively, as a result of the later initiation of the start-up sequence for the second output signal path 140 at time t_enable2. Each of these changes in the voltages VL, VR is smaller than the change that arises in the example shown in FIG. 3 in which both output signal paths 110, 140 are started up simultaneously. Thus, although in the example shown in FIG. 4 there are two changes in the voltage VL, VR across each load, the magnitude of those changes is smaller than if the state changes were synchronised as in the example of FIG. 3, and so any resulting artefacts (e.g. audible clicks or pops, where the loads 130, 160 are audio output transducers, or vibrations or other movements, where the load 130, 160 are haptic transducers) are less perceptible to an end user of a host device incorporating the circuitry 100.

The sequencer circuitry 180 may control the state changes in the first and second output signal paths 110, 140 to implement this staggering or time-offsetting of the state changes in the first and second output signal paths 110, 140, such that state changes in the second output signal path 140 are not synchronised with state changes in the first output signal path 110.

Figure 5:
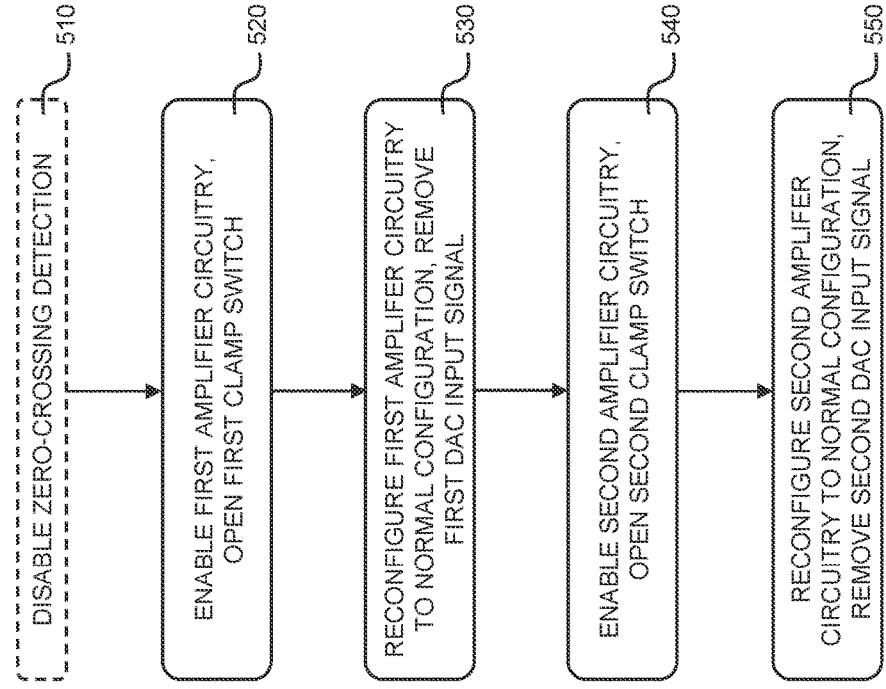
FIG. 5 is a flow diagram illustrating a method performed during a start-up process for the circuitry of FIG. 1.
Figure 5:

FIG. 5 is a flow chart showing steps in a method performed by the sequencer circuitry 180 to control state changes in the first and second output signal paths 110, 140 during start-up of the circuitry 100.

The method, shown generally at 500 in FIG. 5, starts at a first step 510, in which a zero-crossing detection function of the circuitry 100 is disabled. As will be appreciated, this first step 510 is necessary only if the circuitry 100 includes an active zero-crossing detection function, and so where there is no zero-crossing function, or where the zero-crossing function has already been disabled, the first step 510 may be omitted.

As noted above, the first and second output signal paths 110, 140 are typically enabled or disabled simultaneously, in synchronization with a zero-crossing of an input signal from which the first and second digital input signals are derived. By disabling the zero-crossing function (if present and enabled), the second output signal path 110 can be enabled at a different time than the first output signal path 140, to reduce the magnitude of artefacts that may appear in the output signal paths 110, 140.

The method 500 moves on to a step 520, in which the first amplifier circuitry 116 is enabled, e.g. by connecting it to the second positive power supply voltage Vamp+ and the negative power supply voltage Vamp−, and the first clamp switch 120 is opened.

At a subsequent step 530, the first amplifier circuitry 116 is reconfigured, from its unity gain configuration, into its normal configuration, and the digital input signal representing a value of −1 at the input of the first DAC circuitry 112 is turned off or removed, such that the first DAC circuitry 112 receives no input signal.

As described above, the state changes in the first output signal path 110 associated with steps 520, 530 may give rise to artefacts in the first and second output signal paths 440, 140.

With the first output signal path 110 fully enabled, the method proceeds to a step 540, in which the second amplifier circuitry 146 is enabled, e.g. by connecting it to the second positive power supply voltage Vamp+ and the negative power supply voltage Vamp−, and the second clamp switch 150 is opened.

At a subsequent step 550, the second amplifier circuitry 146 is reconfigured, from its unity gain configuration, into its normal configuration, and the digital input signal representing a value of −1 at the input of the second DAC circuitry 142 is turned off or removed, such that the second DAC circuitry 142 receives no input signal.

As described above, the state changes in the second output signal path 140 associated with steps 540, 540 may give rise to artefacts in the first and second output signal paths 110, 140. However, as these artefacts are offset in time from any artefacts arising as a result of the state changes in the first output signal path 110, the artefacts are less perceptible to a user than would be the case if the stage changes in both output signal paths 110, 140 were synchronised.

Figure 6:
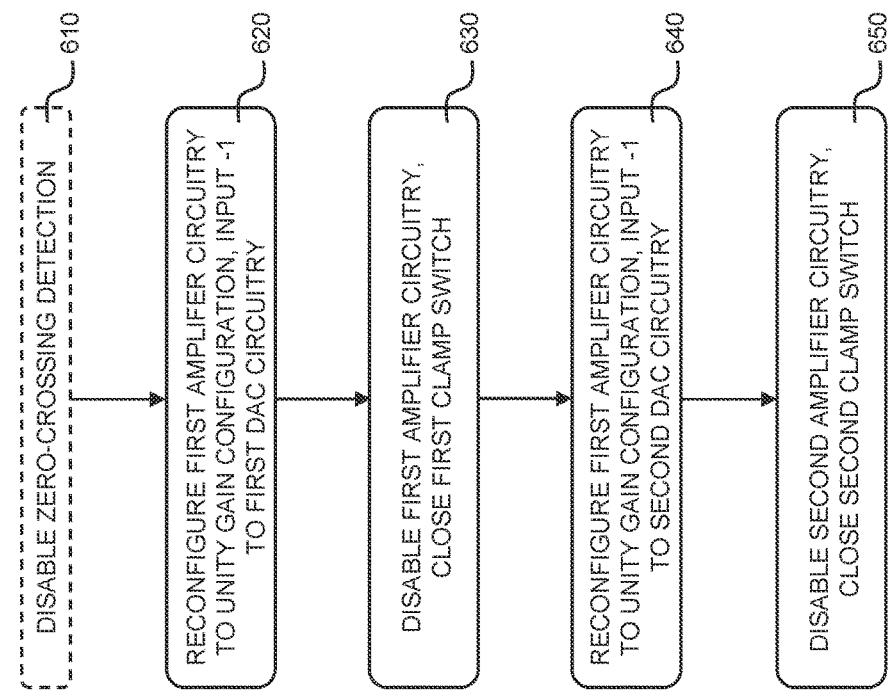
FIG. 6 is a flow diagram illustrating a method performed during a shut-down process for the circuitry of FIG. 1.
Figure 6:
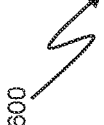

FIG. 6 is a flow chart showing steps in a method performed by the sequencer circuitry 180 to control state changes in the first and second output signal paths 110, 140 during shut-down of the circuitry 100.

The method, shown generally at 600 in FIG. 5, starts at a first step 610, in which a zero-crossing detection function of the circuitry 100 is disabled to allow state changes in the first and second output signal paths to be performed out of synchronisation. As will again be appreciated, this first step 610 is necessary only if the circuitry 100 includes an active zero-crossing detection function, and so where there is no zero-crossing function, or where the zero-crossing function has already been disabled, the first step 610 may be omitted.

The method 600 moves on to a step 620, in which the first amplifier circuitry 116 is reconfigured to its unity-gain configuration, such that the first output signal path 110 operates in a muted mode. An input digital signal representing a value of −1 is supplied to the input of the first DAC circuitry 112.

At a subsequent step 630, the first amplifier circuitry 116 is disabled, e.g. by decoupling it from the second positive power supply voltage Vamp+ and the negative power supply voltage Vamp−, and the first clamp switch 120 is closed.

As described above, the state changes in the first output signal path 110 associated with steps 620, 630 may give rise to artefacts in the first and second output signal paths 440, 140.

With the first output signal path 110 disabled, the method proceeds to a step 640, in which the second amplifier circuitry 146 is reconfigured to its unity-gain configuration, such that the second output signal path 140 operates in a muted mode. An input digital signal representing a value of −1 is supplied to the input of the second DAC circuitry 142.

At a subsequent step 650, the second amplifier circuitry 146 is disabled, e.g. by decoupling it from the second positive power supply voltage Vamp+ and the negative power supply voltage Vamp−, and the second clamp switch 150 is closed.

As described above, the state changes in the second output signal path 140 associated with steps 640, 640 may give rise to artefacts in the first and second output signal paths 110, 140. However, as these artefacts are offset in time from any artefacts arising as a result of the state changes in the first output signal path 110, the artefacts are less perceptible to a user than would be the case if the stage changes in both output signal paths 110, 140 were synchronised.

As will be apparent from the foregoing description, the circuitry and methods of the present disclosure reduce the perceptibility of artefacts that are generated by a load such as an audio output transducer or a haptic output transducer as a result of transient voltages in the first and second output signal paths that arise as a result of state changes in the output signal paths.

In the example described above the circuitry 100 includes two output signal paths, but it will be appreciated that the principles of the present disclosure are applicable to any multi-channel system (i.e. any system having two or more channels or signal paths for driving respective loads).

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving first and second loads, the circuitry comprising:

a first output signal path for supplying a first driving signal to the first load;

a second output signal path for supplying a second driving signal to the second load;

a common ground path coupled to the first and second output signal paths, the common ground path including a common resistor, wherein the first output signal path comprises a first feedback path including the common resistor and the second output signal path comprises a second feedback path including the common resistor; and sequencer circuitry configured to:

disable an active zero-crossing detection function of the circuitry; and initiate a first state change in the first output signal path and a second state change in the second output signal path, wherein the sequencer circuitry is configured to control the initiation of the first and second state changes such that the second state change is not synchronised with the first state change.

2. Circuitry according to claim 1, wherein:

the first output signal path comprises first digital to analog converter (DAC) circuitry and first amplifier circuitry; and the second output signal path comprises second digital to analog converter (DAC) circuitry and second amplifier circuitry.

3. Circuitry according to claim 1, wherein the first load and/or the second load comprises an audio output transducer.

4. Circuitry according to claim 1, wherein the first load and/or the second load comprises a haptic output transducer.

5. Circuitry according to claim 2, wherein the first and second DAC circuitry comprise ground-referenced DAC circuitry, and wherein the first and second amplifier circuitry comprise split-supply amplifier circuitry.

6. Circuitry according to claim 2, further comprising:

a first clamp path coupled to an output of the first amplifier circuitry; and a second clamp path coupled to an output of the second amplifier circuitry.

7. Circuitry according to claim 6, wherein the first and second state changes occur during a start-up process or a shut-down process for the circuitry.

8. Circuitry according to claim 7, wherein the sequencer circuitry is configured to, during the start-up process, enable the second output signal path after enabling the first output signal path.

9. Circuitry according to claim 7, wherein the sequencer circuitry is configured to, during the shut-down process, disable the second output signal path after disabling the first output signal path.

10. An integrated circuit comprising circuitry according to claim 1.

11. A host device comprising circuitry according to claim 1.

12. A host device according to claim 11, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

13. A method for reducing artefacts in a multi-channel system during a state change, the method comprising:

disabling an active zero-crossing detection function of the multi-channel system; and controlling initiation of the state change in each channel such that the state change in one channel is not synchronised with the state change in another channel, wherein the multi-channel system comprises a common ground path for at least the one channel and the another channel, the common ground path comprising a common resistor that is common to feedback paths of the one channel and the another channel.

* * * * *